United States Patent [19]

Kurihara et al.

[11] Patent Number: 5,217,700
[45] Date of Patent: Jun. 8, 1993

[54] PROCESS AND APPARATUS FOR PRODUCING DIAMOND FILM

[75] Inventors: Kazuaki Kurihara; Kenichi Sasaki; Motonobu Kawarada, all of Kawasaki, Japan

[73] Assignee: Fujitsu Limited, Kawasaki, Japan

[21] Appl. No.: 806,246

[22] Filed: Dec. 13, 1991

[30] Foreign Application Priority Data

Dec. 15, 1990 [JP] Japan .................. 2-402541
Mar. 18, 1991 [JP] Japan .................. 3-052467

[51] Int. Cl.$^5$ .................. C01B 31/06; C30B 29/04
[52] U.S. Cl. .................. 423/446; 156/DIG. 68; 427/450
[58] Field of Search ............. 423/446; 156/DIG. 68; 427/249, 34, 39, 450, 577; 204/157.47

[56] References Cited

U.S. PATENT DOCUMENTS

| | | | |
|---|---|---|---|
| 4,416,421 | 11/1983 | Browning | 239/79 |
| 4,938,940 | 7/1990 | Hirose et al. | 156/DIG. 68 |
| 4,981,671 | 1/1991 | Moriyoshi et al. | 156/DIG. 68 |

FOREIGN PATENT DOCUMENTS

| | | |
|---|---|---|
| 57-94360 | 6/1982 | Japan . |
| 64-33096 | 2/1989 | Japan . |
| 2279593 | 11/1990 | Japan .................. 156/DIG. 68 |
| 3-208892 | 9/1991 | Japan . |

OTHER PUBLICATIONS

Websters New Riverside University Dictionary, (1984), p. 806.
Hirose et al., "New Diamond", 1988, No. 10, p. 34. (partial translation attached).

Primary Examiner—Gary P. Straub
Assistant Examiner—Stephen G. Kalinchak
Attorney, Agent, or Firm—Staas & Halsey

[57] ABSTRACT

A process and apparatus for producing a diamond film from a gas phase, in which a fuel gas is burnt by oxygen gas in a torch, to thereby provide a gas flame jet having a high temperature and high speed sufficient to form a high quality diamond film on a substrate, by an unlimited use of various kinds of combustible carbon compound gases as the fuel gas. A process and apparatus for producing a diamond film from a gas phase, in which a thermal spray material is fed to a combustion flame to thereby form an intermediate layer of a mixture of the thermal spray material and diamond between a substrate and a diamond film, to thereby provide a high purity diamond film having an improved adhesion to the substrate.

11 Claims, 10 Drawing Sheets

PROCESS AND APPARATUS FOR PRODUCING DIAMOND FILM

BACKGROUND OF THE INVENTION

1. Field of the Invention

The present invention relates to a process and an apparatus for producing a diamond film on a substrate from a gas phase 2. Description of the Related Art Diamond is one of the hardest materials known, having a Vickers hardness number of 10000, and has a high Young's modulus, a good wear resistance, and a high chemical stability, and further, having a high thermal conductivity of 2000 W/mK, five times that of copper, a good insulation and a low permitivity, and remaining transparent in a wide wavelength range of light from the infrared through to the ultraviolet, and becoming semiconductive when doped with an impurity Because diamond has such excellent properties, it is not only essential as a tool material in high-technology fields but also is used for a variety of applications, including wear resistant coatings, vibrating elements of loudspeakers, transparent coatings of optical instruments, passivation films of semiconductor elements, heat sinks, circuit boards, anti-environmental transistors, and blue light emitting diodes, etc.

Recent studies have led to the proposals of various processes for producing diamond from a gas phase, to be thus able to better utilize these superior properties of diamond.

Hirose et al., "New Diamond", 1988, No. 10, page 34, proposed a process for a fast production of diamond on a substrate placed in the inner flame of an oxygen-acetylene flame. As generally shown in FIG. 1, acetylene gas 302 and oxygen gas 303 are introduced into a torch 301 through the bottom thereof, discharged through the torch top separately or after mixed within the torch 301, and then burnt to form a flame composed of inner and outer flames 304 and 305 The inner flame 304 is applied to a substrate 307 fixed to the lower side surface of a substrate holder 308 cooled with a coolant water 309, to precipitate diamond 306 on the surface of the substrate 307 held in the inner flame 304.

This process is advantageous in that good quality diamond is quickly produced by an extremely simple apparatus and without the use of electric power, but has a disadvantage in that the source gas is limited to an oxygen-acetylene gas, to obtain the high temperature required for the growth of diamond. Acetylene is more dangerous than other hydrocarbon gases, and therefore, is not available in the form of a high pressure bomb, and thus the use thereof requires a frequent replacement of the bombs and is very expensive.

Moreover, this process is essentially disadvantageous in that it generally provides diamond in the form of a granule, and it is difficult to thereby obtain a diamond film useful for a variety of applications.

Another problem with the conventional process is that the adhesion of a diamond film produced from a gas phase is too poor to allow it to be utilized in the above variety of applications.

To improve the adhesion of the diamond film, processes have been proposed by which the diamond nucleation density is increased or an intermediate layer of carbides or other substances is produced, but these proposals are not successful.

The present inventors proposed a DC plasma jet CVD process, which is a high speed process for producing diamond from a gas phase (Japanese Unexamined Patent Publication (Kokai) No. 64-33096), and proposed an improved process in which a metal or ceramics powder is fed to a plasma during the diamond growth by the DC plasma jet CVD process, to form a thermal-sprayed layer containing diamond as an intermediate layer inserted between an innermost metal or ceramics thermal-sprayed layer and an outermost diamond film, to thereby improve the adhesion of the diamond film (Japanese Unexamined Patent Publication (Kokai) No 2-22741).

This process is carried out by an apparatus, as shown in FIG. 2, comprising a cathode 102 connected to the negative port of a DC power supply 104, an anode 101 connected to the positive port of the DC power supply 104 and surrounding the cathode 102, and a flow path for supplying a diamond forming gas 103 used for the diamond growth provided between the cathode 102 and the anode 101 This apparatus also comprises a powder supply nozzle 105 provided around the anode 101 and another flow path, for a carrier gas 106 conveying a metal or ceramics powder, provided between the anode 101 and the powder supply nozzle 105

In a process carried out by using this apparatus, a diamond forming gas 103 and a carrier gas 106 containing a powder are mixed at the outlet of the powder supply nozzle 105, to form a plasma jet 110 which is applied to a substrate 107

In the initial stage of the application of the plasma jet, the powder-containing carrier gas 106 is supplied at a rate or proportion greater than that of the diamond forming gas 103, to thus form a thermal-sprayed layer 108, and then the proportion thereof is gradually reduced or the proportion of the diamond forming gas 103 is increased, to finally form a diamond film 109.

This process has an advantage of forming an intermediate layer consisting of a thermal spray material and diamond between a thermal sprayed layer 108 and a diamond film 109, to thereby continuously produce a highly adhesive diamond film at a high growth rate.

The process, however, has a disadvantage in that, because a DC are discharge is used, the electrode materials of the anode 101 and the cathode 102 are included in the product diamond film 109.

SUMMARY OF THE INVENTION

As a first aspect thereof, an object of the present invention is to provide an inexpensive, safe, easily operable, fast process and apparatus for producing a high purity diamond film, free from impurities, on a substrate having a large area.

As a second aspect thereof, another object of the present invention is to provide a process and an apparatus for producing a high purity diamond film free from an inclusion of impurities and having an improved adhesion to a substrate, at a high growth rate of the diamond film.

To achieve the above object according to the first aspect of the present invention, there is provided a process for producing a diamond film, comprising the steps of:

supplying oxygen gas and a fuel gas containing a combustible carbon compound to a combustion chamber of a torch;

burning the fuel gas by the oxygen gas in the combustion chamber to thereby generate a combustion gas therein;

ejecting the combustion gas from the combustion chamber through a nozzle of the torch to thereby form a gas flame jet; and applying the gas flame jet to a substrate to thereby form a diamond film on the substrate.

According to the first aspect of the present invention, there is also provided an apparatus for producing a diamond film, comprising:

a torch comprising a supply inlet for a fuel gas containing a combustible carbon compound gas, a supply inlet for oxygen gas, a combustion chamber in which the supplied fuel gas is burnt by the supplied oxygen gas, to thereby form a combustion gas, and a nozzle for ejecting said combustion gas to form a gas flame jet;

a mechanism for holding a substrate to which the gas flame jet is applied to thereby form a diamond film thereon;

a mechanism for causing a relative movement of the torch and the substrate; and a gas supply system for supplying the fuel gas and the oxygen gas to the torch through the respective supply inlets.

To achieve the object according to the second aspect of the present invention, there is provided a process for producing a diamond film on a substrate, in which a fuel gas containing a combustible carbon compound is burnt by oxygen gas to form a combustion flame to be applied to a substrate to thereby form a diamond film thereon, comprising the steps of:

feeding a thermal spray material to the combustion flame to form a mixed combustion flame containing the thermal spray material; and varying the feed amount of the thermal spray material to thereby form an intermediate layer of a mixture of the thermal spray material and diamond between the substrate and the diamond film.

According to the second aspect of the present invention, there is also provided an apparatus for producing a diamond film, comprising:

a torch comprising a supply inlet for a fuel gas containing a combustible carbon compound gas, a supply inlet for oxygen gas, a nozzle for ejecting a combustion flame generated by a combustion of the fuel gas by the oxygen, and a means for feeding a thermal spray material to the combustion flame;

a mechanism for holding a substrate to which the combustion flame is applied;

a mechanism for varying a distance between the torch and the substrate; and

A gas supply system for supplying the fuel gas and the oxygen gas to the torch through the respective supply inlets.

DESCRIPTION OF THE PREFERRED EMBODIMENTS

According to the first aspect of the present invention, a source gas is burnt inside a torch to generate a high temperature and high speed gas flame jet required for producing diamond from a gas phase.

Figure 3:
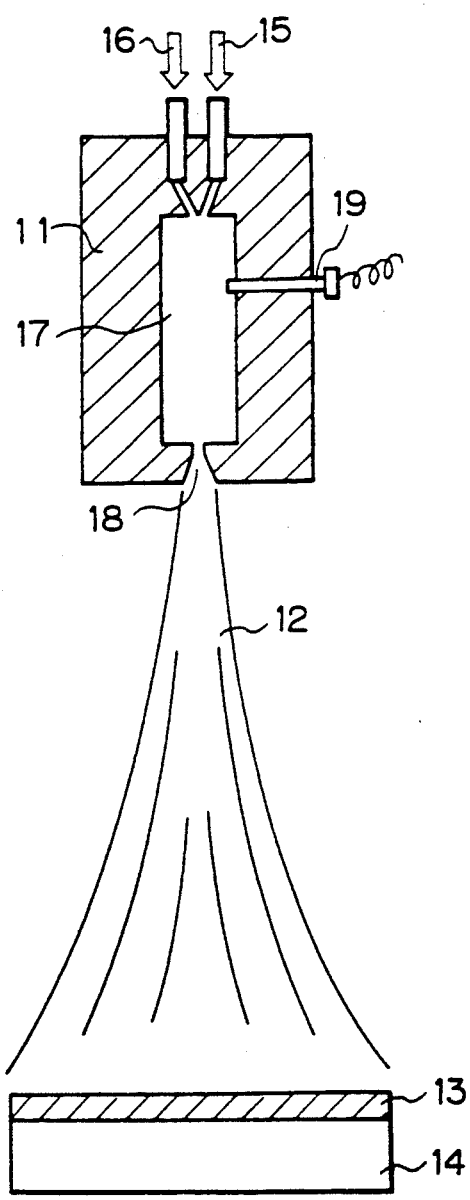
FIG. 3 shows a basic arrangement for carrying out a process for producing a diamond film from a gas phase, according to the first aspect of the present invention.

FIG. 3 schematically depicts the principle of the present invention. Reference numeral 11 denotes a torch, 12 a high speed gas flame jet, 13 a produced diamond film, 14 a water-cooled substrate, 15 a fuel gas, 16 oxygen gas, 17 a combustion chamber of the torch 11, 18 an ejecting nozzle of the torch for a combustion gas, and 19 an ignition plug for firing the fuel gas 15 in the combustion chamber 17.

In the conventional process, a combustion reaction occurs outside a torch at a site at which a fuel gas and oxygen gas leave the torch, and the thus-obtained combustion gas has a relatively low temperature due to an adiabatic expansion. Therefore, only acetylene can be used as the fuel gas providing a high temperature required to produce diamond. The combustion gas is merely a relatively low speed flame, and thus it is difficult to thereby provide diamond in the form of a film.

According to the first aspect of the present invention, a combustion reaction is effected inside the combustion chamber of the torch, to thus easily provide a high temperature combustion gas, due to a constant-volume pressurization, and thus acetylene need not be used to provide a high temperature required to produce diamond from a gas phase. Moreover, a high temperature and high pressure combustion gas generated in the combustion chamber 17 is ejected through the nozzle 18 and forms a high speed gas flame jet 12, which then strikes the water-cooled substrate 14 and is thereby quenched.

Thus, a combustion gas having a non-equilibrium composition, in which active radicals generated due to the high temperature of the combustion chamber 17 are maintained, is supplied to the substrate 14 to ensure a fast growth of diamond. The combustion gas is applied to the substrate 14 in the form of a gas flame jet having an extremely high speed, to provide a high diffusion rate at the reaction interface, and thereby promote the formation of diamond in the form of a film.

The distance between the torch 11 and the substrate 14 is appropriately adjusted to provide a highly uniform gas flame, and the torch 11 and the substrate 14 are moved relatively along the substrate surface, to form a diamond film covering a substrate having a large area or a curved surface.

According to the above-described principle of the first aspect of the present invention, a high combustion temperature and energy sufficient for producing diamond is achieved not only when using acetylene but also when using any one of various kinds of combustible gases containing a carbon compound gas. A fuel gas is preferably composed mainly of a carbon compound gas, particularly, propylene, propane or other hydrocarbons. A mixture of a hydrocarbon gas and hydrogen, particularly a mixture of a hydrocarbon, such as methane, and hydrogen also may be used as a fuel gas. A fuel gas may contain any gas not having an adverse effect on the property of a produced diamond, for the combustion of a fuel gas and the growth of diamond.

To precipitate diamond, the gross composition of a fuel gas and oxygen gas must be carbon-rich. More specifically, a fuel gas and oxygen gas must be supplied at a ratio such that the gross composition has a carbon atom number greater than an oxygen atom number. For example, when carbon monoxide (CO) gas is used as a fuel gas of the present invention, an adjusting gas such as a hydrocarbon gas is added to the fuel gas to provide such a ratio.

The substrate surface usually has a temperature of from 500° to 1200° C. during the growth of diamond. When the substrate temperature is either higher or lower than this range, the produced diamond tends to be amorphous. The substrate surface temperature, however, may be outside the above-mentioned range, provided that the amorphization of diamond can be prevented by selecting other process conditions.

The process atmosphere used for producing a diamond film of the present invention is not limited; an open-to-the air system, a closed atmosphere such as an inert gas atmosphere, and a vacuum system, etc. may be used. A vacuum system has an advantage in that it provides a large pressure differential between the inside and the outside of a torch, and accordingly, a higher gas flame jet speed, to thus increase the diamond growth speed and improve the diamond film quality. Therefore, when a diamond film is used for an application in which an extremely high purity is required, or when a high speed growth is desired, a diamond film of the present invention is preferably produced by ejecting a gas flame jet through a nozzle of a torch into a vacuum, and applying the gas flame jet to a substrate placed in the vacuum. In this case, the apparatus of the present invention will comprise a vacuum chamber communicated with an evacuating system; a torch, a substrate support mechanism, and a means for relatively moving the torch and the substrate being arranged in the vacuum chamber.

As shown in FIG. 3, preferably the torch 11 is provided with an ignition plug 19 as a means for firing a fuel gas by oxygen gas, but other types of torches may be used. For example, the present inventive process may be carried out in an open-to-the-air system in a manner such that a fuel gas 15 and oxygen gas 16 are initially not fired but only allowed to slowly flow out through a nozzle 18, then the discharged mixture of the fuel gas 15 and the oxygen gas 16 is ignited by an ignition instrument such as a cigarette lighter, and after the combustion chamber 17 has captured the fire, the supply rates of the fuel gas 16 and the oxygen gas 15 are raised to thereby cause a high speed gas flame jet 12 to be generated.

According to the second aspect of the present invention, a combustion flame is generally used in the same manner as disclosed by Hirose et al., "New Diamond", 1988, No. 10, page 34, as herein previously discussed The second aspect of the present invention is also effective when coupled with the first aspect of the present invention.

According to the principle of the second aspect of the present invention, a metal or ceramics powder or wire is fed into a combustion flame to thermally spray the material onto a substrate, to thus form an intermediate layer of diamond and the thermal-sprayed material in the above-mentioned processes of producing a diamond film from a gas phase.

Figure 4:
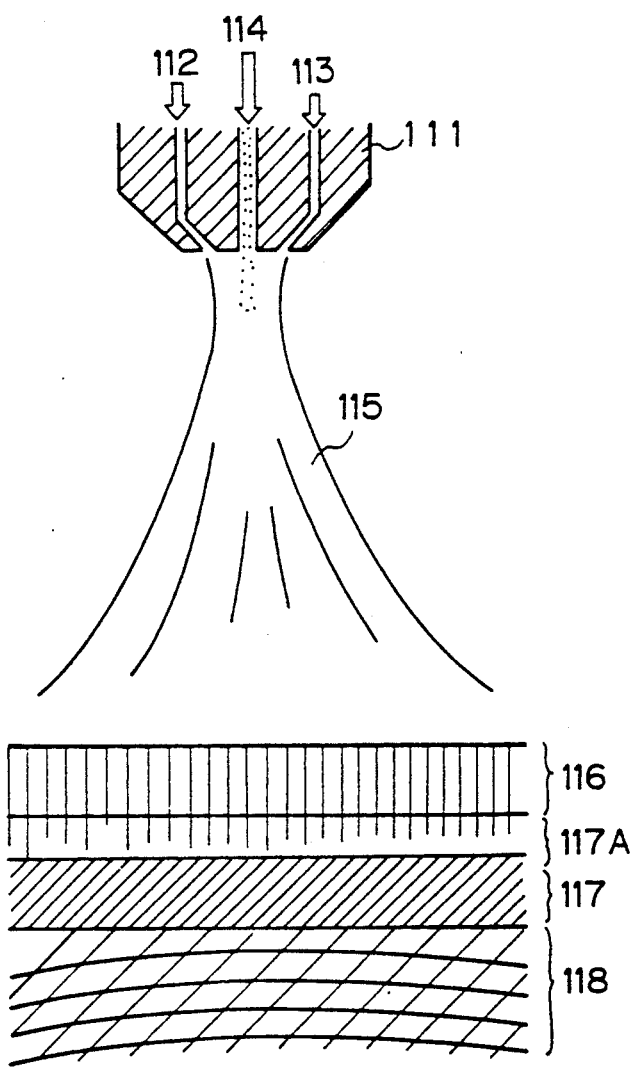
FIG. 4 shows a basic arrangement for carrying out a process for producing a diamond film from a gas phase while effecting a thermal spraying, according to the second aspect of the present invention.

FIG. 4 shows an arrangement for producing a diamond film from a gas phase, and effecting a thermal spraying process according to the second aspect of the present invention.

A torch 111 is provided with flow paths for passing a fuel gas 112, oxygen gas 113, and a "powder gas" or a carrier gas 114 containing a metal or ceramics powder.

These gases are mixed at the tip of the torch 111, accelerated to form a flame 115, and applied to a substrate 118.

During the application of the flame, the mixing ratio of the powder gas 114 is gradually reduced to first form an innermost layer 117 of a thermal spray material on the substrate 118, then form an intermediate layer 117A consisting of a mixture of the thermal spray material and diamond on the thermal-sprayed layer 117, and finally, form an outermost layer or a diamond film 116 on the intermediate layer 117A. In this case, a triple-layered structure composed of the layers 117, 117A, and 116 is formed on the substrate 118 in that order.

In accordance with the process conditions, the innermost layer 117 of a thermal spray material need not be always formed, and in such a case, a double-layered structure composed of the layers 117A and 116 is formed on the substrate 118, in that order.

A diamond film having an optimum adhesion is obtained by using a thermal spray material of the same substance as a substrate and forming an "inclined composition structure" having an intermediate layer of a content of the thermal spray material continuously decreasing with respect to the layer thickness direction towards the outermost diamond film 116. This structure has a thermal expansion coefficient gradually or continuously varying throughout the layers, and therefore, most effectively minimizes a thermal stress between the layers.

The fuel gas is mainly composed of a carbon compound gas or a mixture of a carbon compound gas and hydrogen gas. When it is desired to form a diamond film at a high growth speed, the fuel gas should provide a high combustion temperature, and accordingly, the fuel gas is most preferably composed of, for example, acetylene ($C_2H_2$), propane ($C_3H_8$), propylene ($C_3H_6$), methylacetylene ($C_3H_4$), or a mixture of hydrogen gas and a hydrocarbon gas.

To produce a diamond film according to the second aspect of the present invention, the combustion flame 115 must have a reducing and carbon-rich composition.

Namely, the gross composition of the fuel gas 112 and the oxygen gas must have a number of carbon atoms greater than the number of oxygen atoms.

During the growth of the diamond film, the substrate 118 must be maintained at a temperature of from 500° to 1200° C. A substrate temperature higher than this range may cause a formation of an amorphous or graphite film and a substrate temperature lower than this range may cause a formation of an amorphous or graphite film.

A diamond film may be produced under an atmospheric pressure, although a reduced pressure or vacuum condition prevents an inclusion of nitrogen in the product diamond film, and further, provides a higher growth rate and a higher density of the thermal-sprayed layer 117.

According to the above-described principle of the second aspect of the present invention, a high purity, high quality, and highly adhesive diamond film is produced at a high growth rate, while preventing an inclusion of impurities in the product film.

EXAMPLES

The following Examples 1 to 6 and Comparative Examples 1 to 3 particularly relate to the first aspect of the present invention.

EXAMPLE 1

Figure 5:
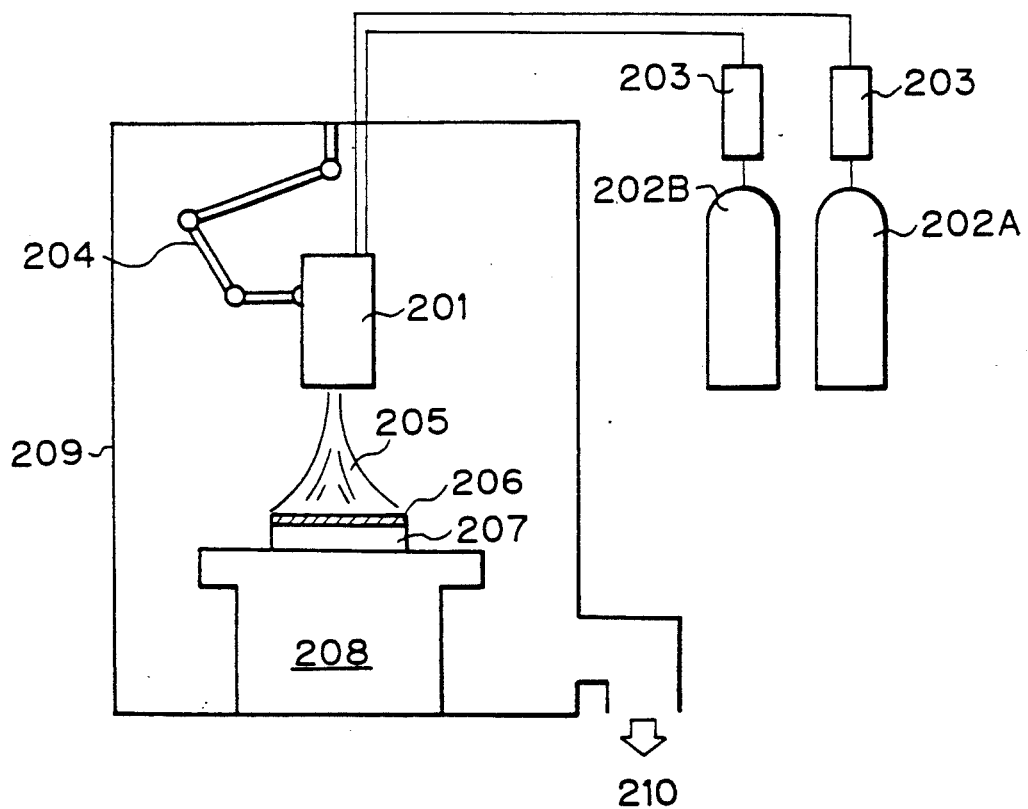
FIG. 5 shows a preferred arrangement for carrying out a process according to the first aspect of the present invention.

A diamond film was produced according to the first aspect of the present invention by using an arrangement as shown in FIG. 5, in which reference numeral 201 denotes a torch, 202A and 202B bombs of a fuel gas and oxygen gas, 203 a regulator for adjusting the gas flow rate, 204 a torch manipulator, 205 a gas flame jet, 206 a diamond film, 207 a substrate, 208 a water-cooled movable copper holder for a substrate, 209 a vacuum chamber, and 210 an evacuating system. The torch 201 has a structure similar to that of the torch 11 of FIG. 3, in which an ignition plug for firing (not shown) is provided. The torch 201 is moved vertically and horizontally by the manipulator 204 and the substrate 207 is moved horizontally by the substrate holder 208.

The torch 201 is water-cooled to prevent overheating of the combustion chamber having a length or height of 50 mm, a diameter of 20 mm, and a nozzle diameter of 5 mm for ejecting a combustion gas.

The chamber 209 was initially open to the air and a molybdenum substrate 207 (20 mm×20 mm, 2 mm thick) was mounted on the substrate holder 208. Propylene, as a fuel gas, was supplied from the bomb 202A at a supply rate of 10 1 min and oxygen gas was supplied from the bomb 202B at a supply rate of 14 l/min, and then an ignition was effected by a not-shown ignition plug.

The chamber 209 was closed to the ambient air and the evacuating system 210 was actuated to reduce the pressure inside the chamber 209 to 200 Torr. The manipulator 204 was actuated to lower the torch 201 until the latter was positioned close to the substrate 207 and the substrate surface was maintained at a temperature of 1000° C. This condition was continued for 1 hour to thus produce a diamond film on the substrate 207.

The product formed on the substrate 207 was examined by X-ray diffraction analysis, Raman spectroscopy, secondary ion mass-spectroscopy (SIMS), and scanning electron microscopy (SEM), and the results showed that the product was a 200 $\mu$m thick polycrystalline film and having only an X-ray diffraction peak from a cubic diamond crystalline system. The Raman spectroscopy showed a sharp peak at 1333 cm$^{-1}$, which is characteristic of diamond. The SIMS detected carbon atoms only.

A high purity diamond film free from impurities and having a good quality was produced at a high growth speed of 200 $\mu$m/hr.

EXAMPLE 2

A diamond film was produced by using the same arrangement and process conditions as used in Example 1, except that a mixture of methane gas (12 l/min) and hydrogen gas (4 l/min) was used as the fuel gas and oxygen was supplied at a flow rate of 20 l/min.

The product was examined in the same manner as Example 1.

A high purity, 110 $\mu$m thick diamond film was obtained at a growth rate of 110 $\mu$m/h.

EXAMPLE 3

A diamond film was produced by using the same arrangement and process conditions as used in Example 1, except that the evacuating system was not actuated and the process was carried out under an open-to-the-air condition.

The product was examined in the same manner as Example 1.

A 120 $\mu$m thick diamond film was obtained.

The SIMS detected a trace amount of nitrogen other than carbon.

EXAMPLE 4

A 300 $\mu$m thick, diamond film was produced by a 1-hour growth process by using the same arrangement and process conditions as used in Example 1, except that acetylene ($C_2H_2$) was used as the fuel gas at a supply rate of 11 l/min and oxygen gas was supplied at a rate of 10 l/min.

Figure 6:
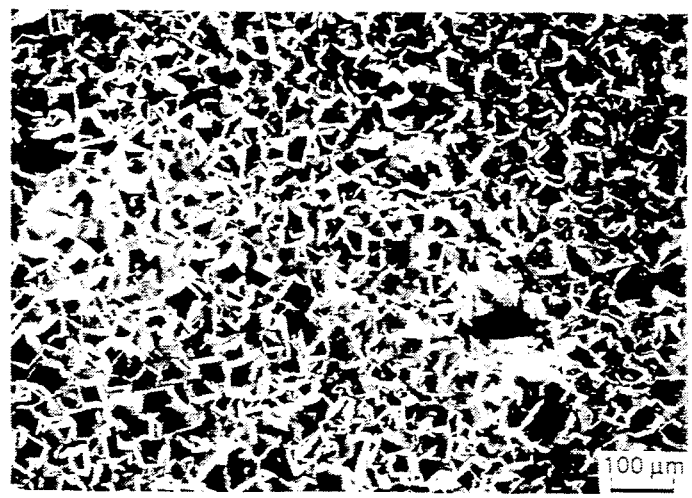
FIG. 6 is a SEM microphotograph showing a magnified view of a diamond film produced according to the first aspect of the present invention.

FIG. 6 is a SEM microphotograph showing the surface of the product diamond film. The surface has a fine and smooth appearance.

EXAMPLE 5

A 240 $\mu$m thick, diamond film was produced by a 1-hour growth process, by using the same arrangement and process conditions as used in Example 1, except that methylacetylene ($C_3H_4$) was used as the fuel gas at a supply rate of 12 l/min and the oxygen gas was supplied at a rate of 15 l/min.

EXAMPLE 6

A 160 $\mu$m thick, diamond film was produced by a 1-hour growth process by using the same arrangement and process conditions as used in Example 1, except that propane ($C_3H_8$) was used as the fuel gas at a supply rate of 12 l/min and the oxygen gas was supplied at a rate of 15 l/min.

COMPARATIVE EXAMPLE 1

Figure 1:
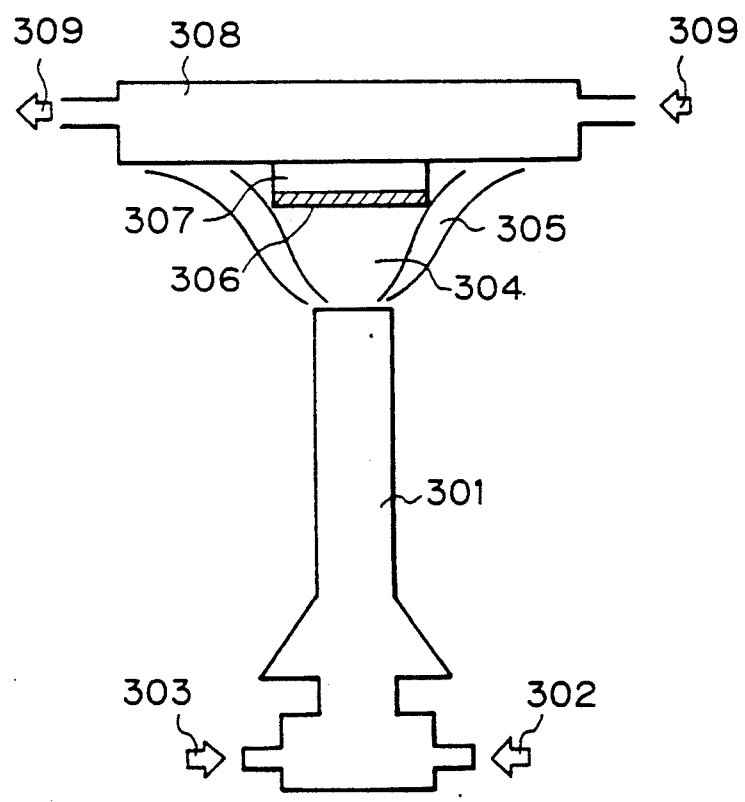
FIG. 1 shows the conventional arrangement for producing a diamond film from a gas phase.

For comparison with Example 4, a 180 $\mu$m thick diamond film was produced by a 1-hour growth process by using a conventional arrangement as shown in FIG. 1, in which the fuel gas and oxygen gas are mixed together and burnt outside a torch. Under a vacuum condition of 200 Torr, acetylene gas was supplied as a fuel gas at a rate of 11 l/min and the oxygen gas was supplied at a rate of 10 l/min.

Figure 7:
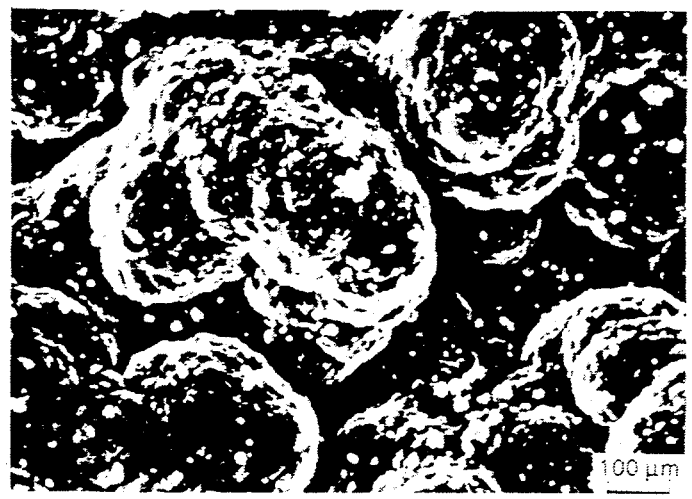
FIG. 7 is a SEM microphotograph showing a magnified view of a diamond film produced by the conventional process by using the arrangement shown in FIG. 1.

FIG. 7 is a SEM microphotograph showing the surface of the product diamond film surface. The surface comprised granules in the form of a ball and had a rough appearance much less smooth than that shown in FIG. 6 and obtained in Example 4 according to the first aspect of the present invention.

COMPARATIVE EXAMPLE 2

For comparison with Example 1, a diamond was produced by a 1-hour growth process by using a conventional arrangement shown in FIG. 1, in which a fuel gas and oxygen gas are mixed together and burnt outside a torch. Under a vacuum condition of 200 Torr, propylene gas was supplied as a fuel gas at a rate of 10 l/min and the oxygen gas was supplied at a rate of 14 l/min. The product comprised granules in the form of a ball having a diameter of about 30 μm, and a diamond film was not obtained.

COMPARATIVE EXAMPLE 3

A growth process was carried out for 1 hour by using a conventional arrangement shown in FIG. 1, in which a fuel gas and oxygen gas are mixed together and burnt outside a torch. Under an open-to-the-air condition, propane gas was supplied as a fuel gas at a rate of 12 l/min and the oxygen gas was supplied at a rate of 15 l/min. The product comprised granules in the form of a ball having a diameter of about 30 μm, and a diamond film was not obtained.

The following Examples 7 and 8 particularly relate to the second aspect of the present invention.

EXAMPLE 7

Figure 8:
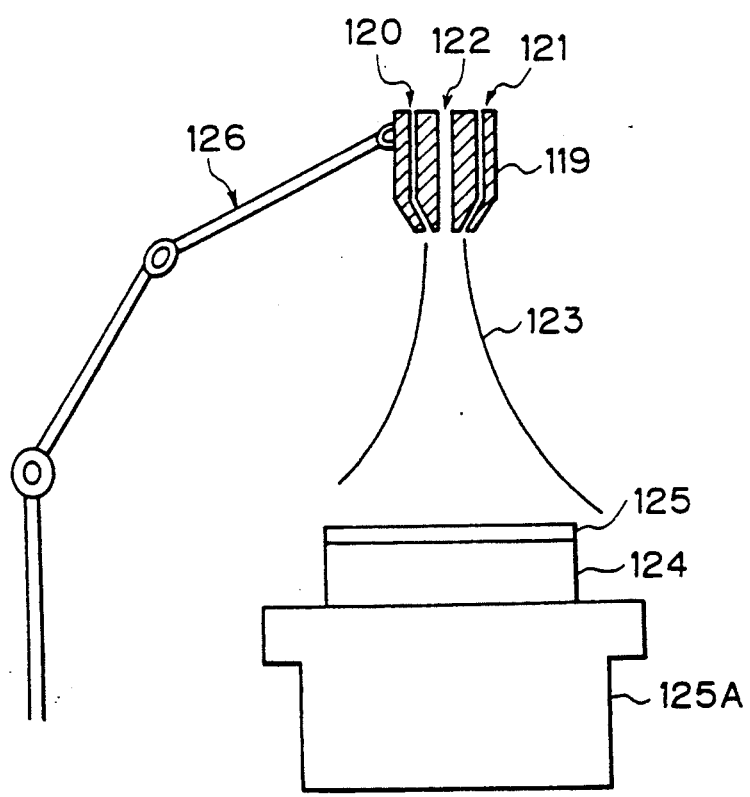
FIG. 8 shows a preferred arrangement for carrying out a process according to the second aspect of the present invention.

FIG. 8 shows an apparatus for producing a diamond film from a gas phase according to the second aspect of the present invention.

A 20×20×5 mm, cemented carbide (WC-12% Co) substrate 124 is fixed on a water-cooled substrate holder 125A. A movable torch 119 is supported at the arm end of a manipulator 126 above the substrate 124. A torch 119 has flow paths formed therein for a passage of a fuel gas 120 of acetylene, oxygen gas 121, and a powder gas 122. These gases are discharged through an ejecting nozzle at the tip of the torch 119 and a combustion reaction then occurs outside the torch 119 to form a combustion flame 123 to be applied to the substrate 124.

The torch 119 is water-cooled to prevent overheating of the combustion chamber having a length or height of 60 mm, a diameter of 20 mm, and a nozzle diameter of 8 mm for ejecting a combustion gas.

A diamond film was produced by a process according to the second aspect of the present invention under an open-to-the air condition, in the following sequence.

Acetylene gas was supplied as a fuel gas 120 at a rate of 20 l/min and the oxygen gas 121 was supplied at a rate of 10 l/min, through the respective flow paths in the torch 119, the gases were fired outside the torch 119 to form a combustion flame 123, to be applied to the substrate 124. The torch 119 was moved downward close to the substrate 124, so that the substrate surface temperature became 1000° C.

A WC-12% Co powder, i.e., the same substance as that of the substrate 124, was fed together with a carrier gas of nitrogen, i.e., in the form of a powder gas 122, through a path in the torch 119 to effect a thermal spraying for 10 min, to thereby form a thermal-sprayed layer of WC-12% Co in the form as denoted by numeral 117 in FIG. 4.

Over the following 30 min, the supply rate of the powder gas 122 was gradually decreased to zero while the supply rate of the oxygen gas 121 was gradually decreased from 20 l/min to 17 l/min, to form an intermediate or mixed layer as denoted by numeral 117A in FIG. 4.

After terminating the supply of the powder gas 122, the supply of the oxygen gas 121 was maintained at 17 l/min and the combustion flame 123 was applied to the substrate 124 for 1 hour, to form a diamond film as denoted by numeral 116 in FIG. 4.

The thus-obtained coating 125 formed on the substrate 124 was analyzed by SEM, X-ray diffraction, EPMA (electron probe micro-analysis) and SIMS, and the adhesion strength was examined by a tensile test.

The SEM observation of the coating cross section showed that the coating 125 had a gross thickness of about 150 μm and the EPMA analysis showed that the coating had a triple-layered structure composed of an innermost layer 117 of the thermal spray material, an intermediate layer 117A of the mixture of the thermal spray material and diamond, and an outermost layer 116 of diamond film, all of the three layers having a thickness of about 50 μm, respectively.

The X-ray diffraction from the outermost surface of the coating 125 detected diamond only, and the X-ray diffraction from the coating cross section detected diamond, WC, and Co but did not detect graphite.

The SIMS analysis of the outermost diamond film 116 detected C, a trace amount of N, and a level of near a detection limit of 0 and H.

The tensile test showed that the adhesion strength was greater than the measurement limit of 150 kg/cm$^2$.

The conventional DC are plasma process cannot prevent an inclusion of W and Cu from electrodes, whereas the present inventive process provides a high purity diamond film free from such impurities while providing an improved adhesion of the diamond film.

EXAMPLE 8

A diamond film was produced by a process according to the second aspect of the present invention under a reduced pressure or vacuum by using an apparatus having a vacuum chamber with an evacuation system.

Figure 9:
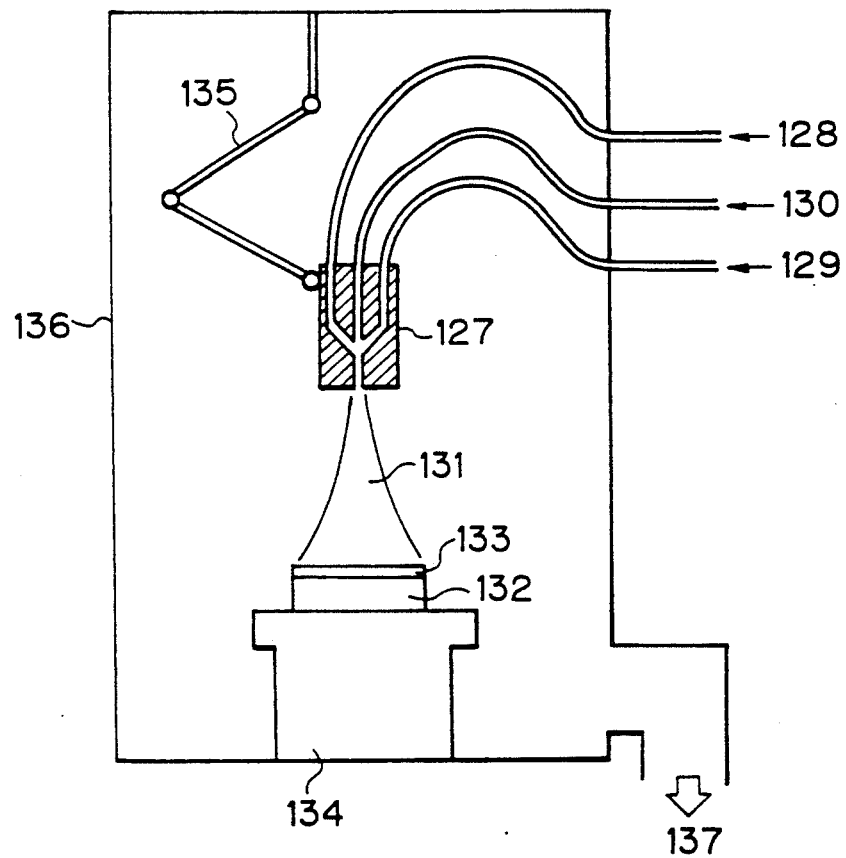
FIGS. 9 shows another preferred arrangement for carrying out a process under a vacuum, according to the second aspect of the present invention.

FIG. 9 shows an arrangement in which a 20×20×5 mm, molybdenum substrate 132 is fixed on a water-cooled substrate holder 134 and a torch 127 is movably supported at the arm end of a manipulator 135 above the substrate 132. The torch 127, the water-cooled substrate holder 134, the substrate 132, and the manipulator 135 are placed in a vacuum chamber 136, which is evacuated through an evacuation port 137.

Pipes for supplying a propylene fuel gas 128, oxygen gas 129, and a powder gas 130 are respectively inserted into the chamber 136 and connected to the torch 127 having paths for passing these gases. The gases are discharged through an ejecting nozzle at the tip of the torch 127 and a combustion reaction then occurs outside the torch 127, to thereby form a combustion flame 131 which strikes or is applied to the substrate 132.

A process of producing a diamond film by using this arrangement was carried out in the following sequence.

Propylene gas was supplied as a fuel gas 128 at a rate of 20 l/min and at a pressure of 6 atm and oxygen gas 129 was supplied at a rate of 30 l/min and at the same pressure of 6 atm through the respective flow paths in the torch 127, and the gases were fired outside the torch 127 to thereby form a combustion flame 131. After the vacuum chamber 136 was evacuated to a pressure of 200 Torr, the combustion flame was applied to the substrate 132. The torch 127 was moved downward close to the substrate 132 so that the substrate surface temperature became 1000° C.

A molybdenum powder, i.e., the same substance as that of the substrate 132, was fed together with a carrier gas of argon, i.e., in the form of a powder gas 130, through a path in the torch 127 to effect a thermal spraying for 5 min, to form a thermal-sprayed layer of molybdenum in the form as denoted by numeral 117 in FIG. 4.

Over the following 10 min, the supply rate of the powder gas 130 was gradually decreased to zero while the supply rate of the oxygen gas 129 was gradually decreased from 30 l/min to 24 l/min, to form an intermediate or mixed layer as denoted by numeral 117A in FIG. 4.

After terminating the supply of the powder gas 130, the supply of the oxygen gas 129 was maintained at 24 l/min and the combustion flame 131 was applied to the substrate 132 for 30 min, to form a diamond film as denoted by numeral 116 in FIG. 4.

The thus-obtained coating 133 formed on the substrate 132 was analyzed by SEM, X-ray diffraction, EPMA, and SIMS and the adhesion strength was examined by a tensile test.

The EPMA analysis showed that the coating 133 had a triple-layered structure composed of an innermost layer 117 of the thermal-sprayed molybdenum having a thickness of about 20 $\mu$m, an intermediate layer 117A of the mixture of the thermal spray material and diamond, having a thickness of about 20 $\mu$m, and an outermost layer or a diamond film 116 having a thickness of about 50 $\mu$m.

The X-ray diffraction from the outermost surface of the coating 133 detected diamond only and the X-ray diffraction from the coating cross section detected diamond, Mo, and $Mo_2C$ but did not detect graphite.

The SIMS analysis of the outermost diamond film 116 detected a level of near the detection limit of O, H, and N.

The tensile test showed that the adhesion strength was greater than the measurement limit of 150 kg/cm$^2$.

The above-described embodiment of the present invention also provides a high purity diamond film having an improved adhesion to a substrate, not otherwise achieved by the conventional process.

This embodiment further provides a higher growth speed by forming a diamond film under a vacuum or reduced pressure in a vacuum chamber with an evacuation system.

The following Examples 9 through 13 and Comparative Example 4 particularly relate to the combined first and second aspects of the present invention.

EXAMPLE 9

Figure 10:
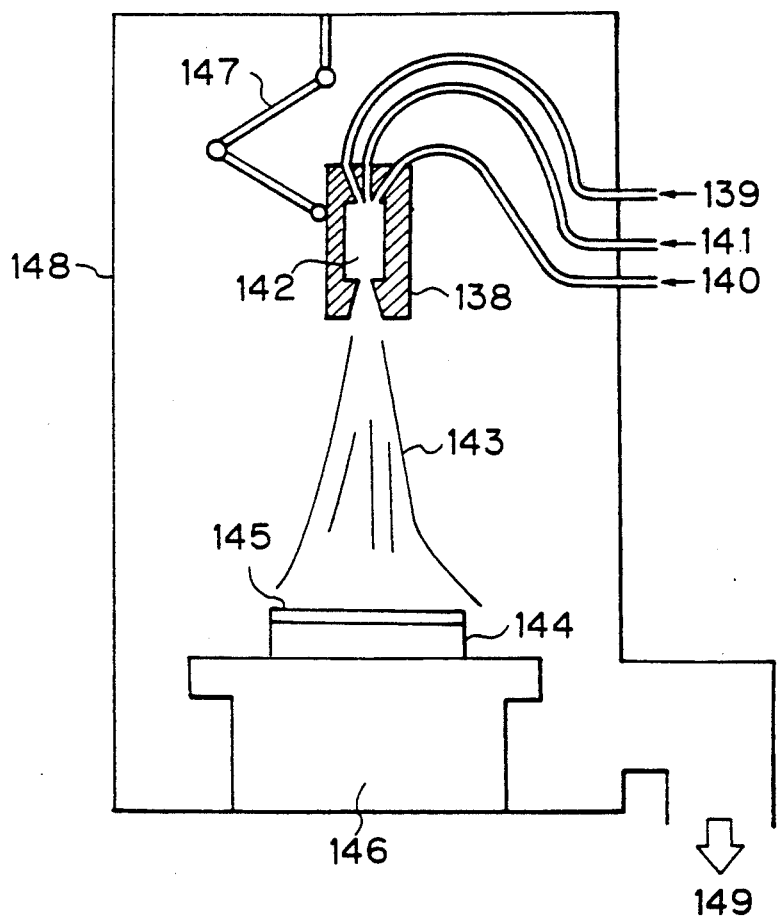
FIG. 10 shows a preferred arrangement for carrying out a process according to the combined first and second aspects of the present invention.

FIG. 10 shows an apparatus for producing a diamond film from a gas phase according to the first and second aspects of the present invention.

A 20×20×5 mm, copper substrate 144 is fixed on a water-cooled substrate holder 146, and a movable internal combustion torch 138 is supported at the arm end of a manipulator 147 above the substrate 144.

The internal combustion torch 138, the water-cooled substrate holder 146, the substrate 144, and the manipulator 147 are placed in a vacuum chamber 148, which is evacuated through an evacuation port 149.

Pipes for supplying a propane fuel gas 139, oxygen gas 140, and a powder gas 141 are inserted respectively into the chamber 148 and connected to the torch 138 having paths through which these gases are fed to a combustion chamber 142 provided inside the torch 138.

A combustion reaction of the supplied gases occurs in the combustion chamber 142 of the torch 138 and a combustion gas generated therein is discharged through an ejecting nozzle at the tip of the torch 138 to thereby form a high speed gas flame jet 143 which strikes or is applied to the surface of the substrate 144.

A diamond film was produced by a process according to the combined first and second aspects of the present invention in the following sequence.

Propane gas was supplied as a fuel gas 139 at a rate of 20 l/min and a pressure of 5 atm, and oxygen gas 140 was supplied at a rate of 30 l/min and at the same pressure of 5 atm, to the combustion chamber 142 in the torch 138, the gases were fired to initiate a combustion reaction in the combustion chamber 142 and the thus formed combustion gas was ejected from the torch 138 to form a high speed gas flame jet 143. After the vacuum chamber 148 was evacuated to a pressure of 200 Torr, the gas flame jet 143 was applied to the substrate 144. The torch 138 was moved downward close to the substrate 144, so that the substrate surface temperature became 900° C.

A copper powder, i.e., the same substance as that of the substrate 144, was fed together with a carrier gas of argon, i.e., in the form of a powder gas 141, to the combustion chamber 142 of the torch 138 to effect a thermal spraying for 5 min, to thereby form a thermal-sprayed layer of copper in the form as denoted by numeral 117 in FIG. 4.

In the subsequent 10 min, the supply rate of the powder gas 141 was gradually decreased to zero while the supply rate of the oxygen gas 140 was gradually decreased from 30 l/min to 24 l/min, to form an intermediate or mixed layer in the form such as denoted by numeral 117A in FIG. 4.

After terminating the supply of the powder gas 141, the supply of the oxygen gas 140 was maintained at 24 l/min and the gas flame jet 143 was applied to the substrate 144 for 1 hour, to form a diamond film in the form such as denoted by numeral 116 in FIG. 4.

The thus-obtained coating 145 formed on the substrate 144 was analyzed by SEM, X-ray diffraction, EPMA and SIMS, and the adhesion strength was examined by a tensile test.

The EPMA analysis of the coating cross section showed that the coating 145 had a triple-layered structure composed of an innermost layer 117 of the thermal-sprayed copper having a thickness of about 20 $\mu$m, an intermediate layer 117A of the mixture of the thermal spray material and diamond, having a thickness of about 25 $\mu$m, and an outermost layer 116 of a diamond film having a thickness of about 120 $\mu$m.

The X-ray diffraction from the outermost surface of the coating 145 detected diamond only and the X-ray diffraction from the coating cross section detected diamond and Cu but did not detect graphite.

The SIMS analysis of the outermost diamond film 116 detected a level of near detection limit of O, H and N.

The tensile test showed that the adhesion strength was greater than the measurement limit of 150 kg/cm$^2$.

The above-described embodiment of the present invention provides a high purity diamond film having an improved adhesion, not attainable by the conventional process.

This embodiment further provides a higher growth speed by forming a diamond film under a vacuum or reduced pressure in a vacuum chamber with an evacuation system.

EXAMPLE 10

A diamond film was produced by a process according to the combined first and second aspects of the present invention by using the apparatus shown in FIG. 10 in the following sequence.

A 20×20×5 mm, molybdenum substrate 144 was fixed on a water-cooled substrate holder 146.

The evacuation system was not actuated and the process was carried out under an open-to-the-air condition.

Propylene gas was supplied as a fuel gas 139 at a rate of 20 l/min and at a pressure of 5 atm, and oxygen gas 140 was supplied at a rate of 30 l/min and at the same pressure of 5 atm to the combustion chamber 142 in the torch 138, the gases were fired to initiate a combustion reaction in the combustion chamber 142, and the thus formed combustion gas was ejected from the torch 138 to form a high speed gas flame jet 143, which struck or was applied to the substrate 144. The torch 38 was moved downward close to the substrate 144, so that the substrate surface temperature became 900° C.

A molybdenum powder, i.e., the same substance as that of the substrate 144, was fed together with a carrier gas of argon, i.e., in the form of a powder gas 141, to the combustion chamber 142 of the torch 138 to effect a thermal spraying for 5 min, to thereby form a thermal-sprayed layer of molybdenum in the form as denoted by numeral 117 in FIG. 4.

Over the following 10 min, the supply rate of the powder gas 141 was gradually decreased to zero while the supply rate of the oxygen gas 140 was gradually decreased from 30 l/min to 24 l/min, to form an intermediate or mixed layer in the form as denoted by numeral 117A in FIG. 4.

After terminating the supply of the powder gas 141, the supply of the oxygen gas 140 was maintained at 24 l/min and the gas flame jet 143 was applied to the substrate 144 for 1 hour, to form a diamond film in the form as denoted by numeral 116 in FIG. 4.

The thus-obtained coating 145 formed on the substrate 144 was analyzed by SEM, X-ray diffraction, EPMA and SIMS, and the adhesion strength was examined by a tensile test.

The EPMA analysis of the coating cross section showed that the coating had a triple-layered structure composed of an innermost layer 117 of the thermal-sprayed molybdenum having a thickness of about 50 μm, an intermediate layer 117A of the mixture of the thermal spray material and diamond, having a thickness of about 40 μm, and an outermost layer 116 of a diamond film having a thickness of about 120 μm.

The X-ray diffraction from the outermost surface of the coating 145 detected diamond only and the X-ray diffraction from the coating cross section detected diamond, Mo, and $Mo_2C$ but did not detect graphite.

The SIMS analysis of the outermost diamond film 116 detected a level of near the detection limit of O and H, and a trace amount of N.

The tensile test showed that the adhesion strength was greater than the measurement limit of 150 kg/cm².

EXAMPLE 11

Figure 11:
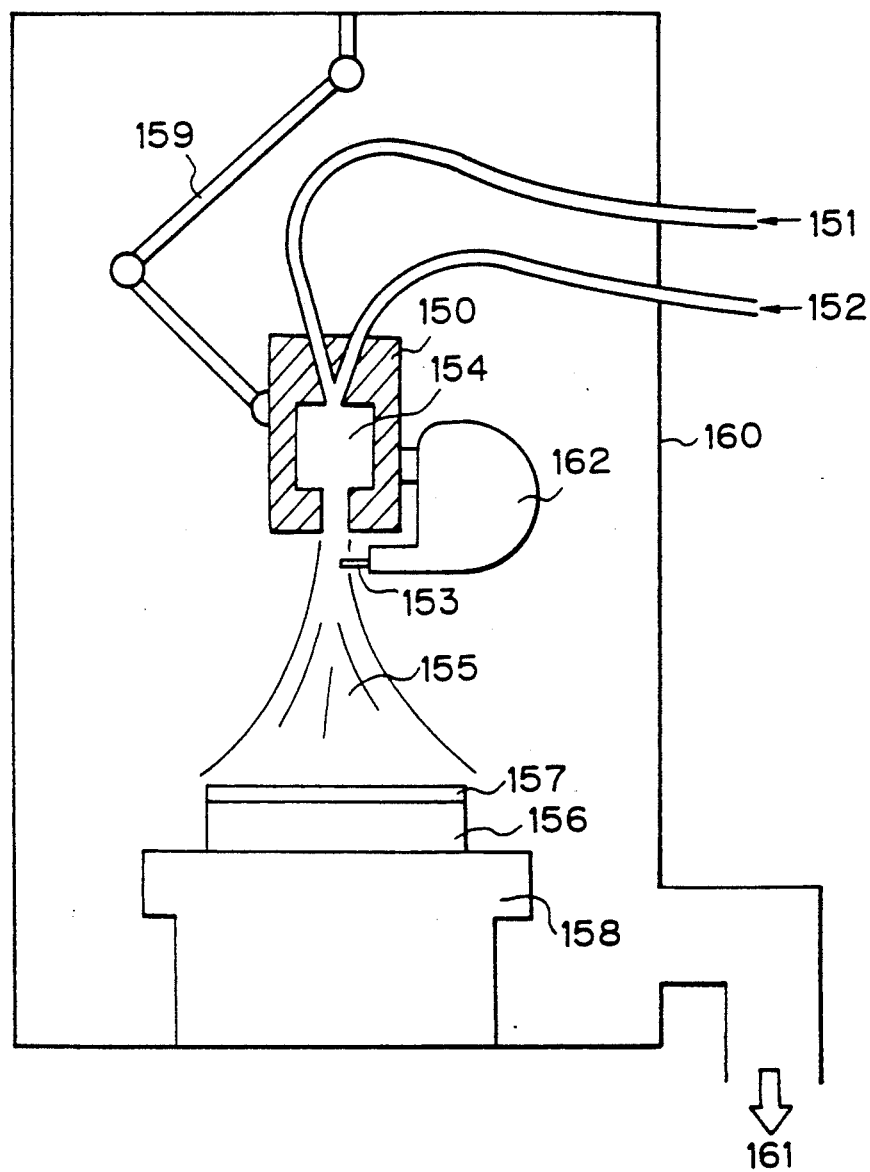
FIG. 11 shows another preferred arrangement for carrying out a process according to the combined first and second aspects of the present invention.

FIG. 11 shows an apparatus for producing a diamond film from a gas phase according to the combined first and second aspects of the present invention.

Reference numeral 150 denotes a torch, 151 a fuel gas, 152 oxygen gas, 153 a wire of a thermal spray material, 154 a combustion chamber, 155 a gas flame jet, 156 a substrate, 157 a product coating formed on the substrate 156, 158 a water-cooled substrate holder, 159 a manipulator movably supporting the torch 150 at the arm end, 160 a vacuum chamber, 161 an evacuating port, and 162 a device for supplying the wire 153.

A 20×20×5 mm, molybdenum substrate 156 was fixed on a water-cooled substrate holder 158.

Propane gas was supplied as a fuel gas 151 at a rate of 20 l/min and at a pressure of 5 atm and oxygen gas 152 was supplied at a rate of 30 l/min and at the same pressure of 5 atm, to the combustion chamber 154 in the torch 150, the gases were fired to initiate a combustion reaction in the combustion chamber 154, and the thus formed combustion gas was ejected from the torch 150 to thereby form a high speed gas flame jet 155. After the vacuum chamber 160 was evacuated to a pressure of 200 Torr, the gas flame jet 155 was applied to the substrate 156. The torch 150 was moved downward, close to the substrate 156, so that the substrate surface temperature became 900° C.

A 0.1 mm dia., molybdenum wire 153, i.e., the same substance as that of the substrate 156, was fed at a rate of 2500 mm/min to the gas flame jet 155 to effect a thermal spraying for 5 min, to thereby form a thermal-sprayed layer of molybdenum in the form as denoted by numeral 117 in FIG. 4.

Over the following 10 min, the feed rate of the molybdenum wire 153 was decreased initially to 100 mm/min and then gradually decreased from 100 mm/min to zero while the supply rate of the oxygen gas 152 was gradually decreased from 30 l/min to 24 l/min, to thereby form an intermediate or mixed layer in the form as denoted by numeral 117A in FIG. 4.

After terminating the supply of the molybdenum wire 153, the supply of the oxygen gas 152 was maintained at 24 l/min and the gas flame jet 155 was applied to the substrate 156 for 1 hour, to form a diamond film in the form as denoted by numeral 116 in FIG. 4.

The thus-obtained coating 157 formed on the substrate 156 was analyzed by SEM, X-ray diffraction, EPMA and SIMS, and the adhesion strength was examined by a tensile test.

The SEM and EPMA analyses of the cross section of the coating 157 showed that the coating 157 had a triple-layered structure composed of an innermost layer 117 of the thermal-sprayed molybdenum having a thickness of about 50 μm, and intermediate layer 117A of the mixture of the thermal-sprayed molybdenum and diamond having a thickness of about 25 μm, and an outermost layer 116 of diamond film having a thicknesses of about 120 μm.

The X-ray diffraction from the outermost surface of the coating 157 detected diamond only and the X-ray diffraction from the coating cross section detected diamond, Mo, and $Mo_2C$ but did not detect graphite.

The SIMS analysis of the outermost diamond film 116 detected a level of near the detection limit of O, H and N.

The tensile test showed that the adhesion strength was greater than the measurement limit of 150 kg/cm².

EXAMPLE 12

A diamond film was produced by using the apparatus shown in FIG. 11.

A 20×20×5 mm, molybdenum substrate 156 was fixed on a water-cooled substrate holder 158.

Propane gas was supplied as a fuel gas 151 at a rate of 20 l/min and at a pressure of 5 atm and oxygen gas 152 was supplied at a rate of 30 l/min and at the torch 150, the gases were fired to initiate a combustion reaction in the combustion chamber 154, and the thus formed combustion gas was ejected from the torch 150 to thereby form a high speed gas flame jet 155. After the vacuum chamber 160 was evacuated to a pressure of 200 Torr, the gas flame jet 155 was applied to the substrate 156. The torch 150 was moved downward, close to the substrate 156, so that the substrate surface temperature became 900° C.

A 0.1 mm dia., molybdenum wire 153, i.e., the same substance as that of the substrate 156, was fed at a rate of 2500 mm/min to the gas flame jet 155 to effect a thermal spraying for 5 min, to form a thermal-sprayed layer of molybdenum in the form such as denoted by numeral 117 in FIG. 4.

Over the following 30 min, the molybdenum wire 153 was supplied at a decreased rate of 500 mm/min and the oxygen gas 152 was supplied at a rate of 24 l/min, to form an intermediate or mixed layer in the form as denoted by numeral 117A in FIG. 4.

After terminating the supply of the molybdenum wire 153, the supply of the oxygen gas 152 was maintained at 24 l/min and the gas flame jet 155 was applied to the substrate 156 for 1 hour, to form a diamond film in the form as denoted by numeral 116 in FIG. 4.

The thus-obtained coating 157 formed on the substrate 156 was analyzed by SEM, X-ray diffraction, EPMA and SIMS, and the adhesion strength was examined by a tensile test.

The SEM and EPMA analyses of the cross section of the coating 157 showed that the coating 157 had a triple-layered structure composed of an innermost layer 117 of the thermal-sprayed molybdenum having a thickness of about 50 μm, an intermediate layer 117A of the mixture of the thermal-sprayed molybdenum and diamond having a thickness of about 90 μm, and an outermost layer 116 of diamond film having a thickness of about 120 μm. The intermediate mixed layer 117A of the thermal-sprayed material and diamond had a substantially uniform composition, not an inclined composition.

The X-ray diffraction from the outermost surface of the coating 157 detected diamond only and the X-ray diffraction from the coating cross section detected diamond, Mo, and $Mo_2C$ but did not detect graphite.

The SIMS analysis of the outermost diamond film 116 detected a level of near the detection limit of O, H and N.

The tensile test showed that the adhesion strength was greater than the measurement limit of 150 kg/cm².

EXAMPLE 13

A diamond film was produced by using the apparatus shown in FIG. 11.

A 20×20×5 mm, molybdenum substrate 156 was fixed on a water-cooled substrate holder 158.

Propane gas was supplied as a fuel gas 151 at a rate of 20 l/min and at a pressure of 5 atm and oxygen gas 152 was supplied at a rate of 24 l/min and at the same pressure of 5 atm, to the combustion chamber 154 in the torch 150, the gases were fired to initiate a combustion reaction in the combustion chamber 154 and the thus formed combustion gas was ejected from the torch 150 to thereby form a high speed gas flame jet 155. After the vacuum chamber 160 was evacuated to a pressure of 200 Torr, the gas flame jet 155 was applied to the substrate 156. The torch 150 was moved downward, close to the substrate 156, so that the substrate surface temperature became 900° C.

A 0.1 mm dia., molybdenum wire 153, i.e., the same substance as that of the substrate 156, was fed at a rate of 1000 mm/min to the gas flame jet 155 to effect a thermal spraying for 5 min, to form a thermal-sprayed layer of molybdenum in the form as denoted by numeral 117 in FIG. 4.

Over the following 10 min, the molybdenum wire 153 was supplied at a decreased rate of 500 mm/min, and for a further 10 min, the wire 153 was supplied at a further decreased rate of 250 mm/min, while the supply rate of the oxygen gas 152 was maintained at 24 l/min, to form an intermediate or mixed layer in the form as denoted by numeral 117A in FIG. 4.

After terminating the supply of the molybdenum wire 153, the supply of the oxygen gas 152 was maintained at 24 l/min and the gas flame jet 155 was applied to the substrate 156 for 1 hour, to form a diamond film in the form as denoted by numeral 116 in FIG. 4.

The thus-obtained coating 157 formed on the substrate 156 was analyzed by SEM, X-ray diffraction, EPMA and SIMS, and the adhesion strength was examined by a tensile test.

The SEM and EPMA analyses of the cross section of the coating 157 showed that the coating 157 apparently had a double-layered structure composed of an intermediate layer 117A of the mixture of the thermal-sprayed molybdenum and diamond having a thickness of about 75 μm and an outermost layer 116 of diamond film having a thickness of about 120 μm. The intermediate layer 117A of the thermal-sprayed molybdenum and diamond had a composition which was not continuously inclined, and the detection intensities of Mo and C varied over three steps; the intermediate layer 117A being composed of three sublayers having thicknesses of about 20, 30, and 25 μm, respectively.

The X-ray diffraction from the outermost surface of the coating 157 detected diamond only, and the X-ray diffraction from the coating cross section detected diamond, Mo, and $Mo_2C$ but did not detect graphite.

The SIMS analysis of the outermost diamond film 116 detected a level of near the detection limit of O, H and N.

The tensile test showed that the adhesion strength was greater than the measurement limit of 150 kg/cm².

COMPARATIVE EXAMPLE 4

Figure 2:
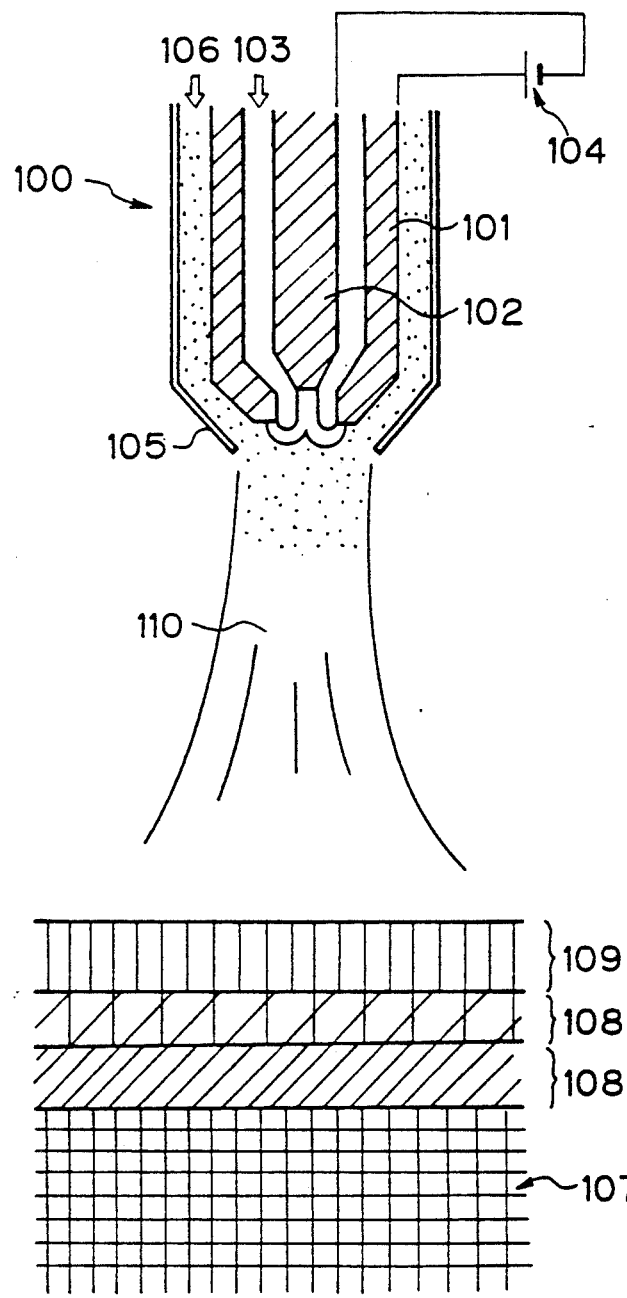
FIG. 2 shows the conventional arrangement for producing a diamond film from a gas phase while effecting a thermal spraying.

A diamond film was produced by a conventional DC plasma jet process by using an apparatus shown in FIG. 2.

A 20×20×5 mm, molybdenum substrate 107 was fixed on a water cooled substrate holder (not shown). Hydrogen was supplied as a plasma gas at a rate of 50 l/min and a plasma jet was generated under condition of a methane concentration of 5%, a pressure of 50 Torr, and a discharge power of 10 kW and applied to the substrate 107. The torch 100 was moved downward, close to the substrate 107, so that the substrate temperature became 900° C. A molybdenum powder was fed together with a carrier gas of argon, i.e., in the form of a powder gas 106, to the torch 100 to effect a thermal spraying for 5 min, to form a thermal-sprayed layer 108.

Over the following 30 min, the supply rate of the powder gas 106 was gradually decreased to zero, to form an intermediate mixed layer 108A.

After terminating the supply of the powder gas 106, the process continued for 1 hour, to form a diamond film 109.

The product coating (108, 108A, 109) was analyzed by SEM, X-ray diffraction, EPMA and SIMS, and the adhesion strength was examined by a tensile test.

The SEM and EPMA analyses of the cross section of the coating showed that it had a triple-layered structure composed of an innermost layer 108 of the thermal-sprayed molybdenum having a thickness of about 20 μm, an intermediate layer 108A of the mixture of the thermal-sprayed molybdenum and diamond having a thickness of about 120 μm, and an outermost layer 109 of diamond having a thickness of about 160 μm. The intermediate layer had a composition which continuously varied throughout the thickness.

The SIMS analysis from the outermost surface of the coating detected diamond only and the X-ray analysis from the cross section of the coating detected diamond, Mo, and $Mo_2C$ but did not detect graphite.

The X-ray analysis of the outermost diamond layer 109 detected about 100 ppm of Cu and about 20 ppm of W other than C, and also detected a level of near the detection limit of O, H, and N.

The tensile test showed that the coating had an adhesion strength greater than the measurement limit of 150 kg/mm².

Tables 1 to 3 summarize the process conditions used in Examples 1 to 13 and Comparative Examples 1 to 4.

TABLE 1

| Example No. | 1 | 2 | 3 | 4 | 5 | 6 | C.E. 1 | C.E. 2 | C.E. 3 |
|---|---|---|---|---|---|---|---|---|---|
| FIG. | 3, 5 | 3, 5 | 3, 5 | 3, 5 | 3, 5 | 3, 5 | 1 | 1 | 1 |
| Fuel | $C_3H_6$ | $CH_4, H_2$ | $C_3H_6$ | $C_2H_2$ | $C_3H_4$ | $C_3H_8$ | $C_2H_2$ | $C_3H_6$ | $C_3H_8$ |
| (l/min) | 10 | 10  4 | 10 | 11 | 12 | 12 | 11 | 10 | 12 |
| (atm) | 5 | 5  5 | 5 | 5 | 5 | 5 | 1.5 | 1.5 | 1.5 |
| Oxygen | | | | | | | | | |
| (l/min) | 14 | 20 | 14 | 10 | 15 | 15 | 10 | 14 | 15 |
| (atm) | 5 | 5 | 5 | 5 | 5 | 5 | 1.5 | 1.5 | 1.5 |
| Atmosphere | | Air | Air | | | | | | Air |
| (torr) | 200 | | | 200 | 200 | 200 | 200 | 200 | |
| Products | Film | Film | Film | Film | Film | Film | Film | Granule | Granule |
| Growth rate (μm/h) | 200 | 110 | 120 | 300 | 240 | 160 | 180 | — | — |
| Surface | | | | | FIG. 6 | | FIG. 7 | | |

(C.E.: Comparative Example)

TABLE 2

| | (Second Aspect) | |
|---|---|---|
| Example No. | 7 | 8 |
| FIG. | 8 | 9 |
| Substrate | WC—Co | Mo |
| Powder | WC—Co | Mo |
| Fuel | $C_2H_2$ | $C_3H_6$ |
| (l/min) | 20 | 20 |
| (atm) | 1.5 | 6 |
| Oxygen | | |
| (l/min) | 20–17 | 30–24 |
| (atm) | 1.5 | 6 |
| Atmosphere | Air | |
| (torr) | | 200 |

TABLE 3

| | (First and Second Aspects) | | | | | |
|---|---|---|---|---|---|---|
| Example No. | 9 | 10 | 11 | 12 | 13 | C.E. 4 |
| FIG. | 10 | 10 | 10 | 10 | 10 | 2 |
| Substrate | Cu | Mo | Mo | Mo | Mo | Mo |
| Powder | Cu | Mo | Mo (wire) | Mo (wire) | Mo (wire) | Mo |
| Fuel | $C_3H_8$ | $C_2H_6$ | $C_3H_8$ | $C_3H_8$ | $C_3H_8$ | Plasma gas |
| (l/min) | 20 | 20 | 20 | 20 | 20 | $H_2$ 50 l/min |
| (atm) | 5 | 5 | 5 | 5 | 5 | $CH_4$ 2.5 l/min |
| Oxygen | | | | | | Power |
| (l/min) | 30–24 | 30–24 | 30–24 | 30–24 | 30–24 | 10 kW |
| (atm) | 5 | 5 | 5 | 5 | 5 | |
| Atmosphere | | Air | | | | |
| (torr) | | | | | | |

As described above, the first aspect of the present invention provides an inexpensive, safe, easily operable, fast process and apparatus for producing a high purity diamond film free from impurities on a substrate having a large area.

In the second aspect thereof, the present invention provides a process and an apparatus for producing a high purity diamond film free from an inclusion of impurities and having a high quality at a high growth rate of the diamond film.

We claim:

1. A process for producing a diamond film, comprising the steps of:
supplying oxygen gas and a fuel gas containing a combustible carbon compound to a combustion chamber of a torch at a ratio such that a gaseous mixture is formed having an atomic ratio of carbon greater than the atomic ratio of oxygen;

burning said gaseous mixture in said combustion chamber to thereby generate a carbon-rich combustion gas having reducing properties in said chamber;

ejecting said combustion gas from said combustion chamber through a nozzle of said torch to thereby form a gas flame jet;

applying said gas flame jet to a substrate while maintaining the substrate at a temperature of from 500° C. to 1200° C. to thereby form a diamond film on said substrate.

2. A process according to claim 1, wherein said fuel gas is mainly composed of a carbon compound gas.

3. A process according to claim 1, wherein said fuel gas is mainly composed of a mixture of a carbon compound gas and hydrogen gas.

4. A process according to claim 1, wherein said carbon compound is a hydrocarbon.

5. A process according to claim 1, wherein said combustion gas is ejected from said combustion chamber through said nozzle of said torch into an atmosphere having a reduced pressure, to thereby form said gas flame jet, and the gas flame jet is applied to said substrate while said substrate is held in said atmosphere.

6. A process according to claim 1, wherein said fuel gas comprises acetylene, propane, propylene, methylacetylene, or a mixture of hydrogen gas and a hydrocarbon gas.

7. A process according to claim 1, said process comprising the further steps of:

feeding a thermal spray material to said gas flame jet; and varying the feed amount of said thermal spray material to thereby form an intermediate layer of a mixture of said thermal spray material and diamond between said substrate and said diamond film.

8. A process according to claim 7, wherein said thermal spray material is fed in the form of a powder gas comprising a powder of said thermal spray material mixed with and carried by a carrier gas.

9. A process according to claim 7, wherein said thermal spray material is fed in the form of a wire.

10. A process according to claim 7, wherein said process is carried out in an atmosphere having a reduced pressure.

11. A process according to claim 7, wherein the feed amount of said thermal spray material is varied to thereby form said intermediate layer in which a content of said thermal spray material is decreased continuously with respect to the direction from said substrate towards said diamond film.

* * * * *